United States Patent
Yu et al.

(10) Patent No.: US 8,774,425 B2
(45) Date of Patent: Jul. 8, 2014

(54) METHOD AND APPARATUS FOR CONTROLLING GAIN IN MULTI-AUDIO CHANNEL SYSTEM, AND VOICE PROCESSING SYSTEM

(75) Inventors: Shuian Yu, Shenzhen (CN); Cong Geng, Shenzhen (CN)

(73) Assignee: Huawei Device Co., Ltd. (CN)

( * ) Notice: Subject to any disclaimer, the term of this patent is extended or adjusted under 35 U.S.C. 154(b) by 319 days.

(21) Appl. No.: 13/176,206

(22) Filed: Jul. 5, 2011

(65) Prior Publication Data

US 2011/0261968 A1 Oct. 27, 2011

Related U.S. Application Data

(63) Continuation of application No. PCT/CN2009/076051, filed on Dec. 25, 2009.

(30) Foreign Application Priority Data

Jan. 5, 2009 (CN) .......................... 2009 1 0001506

(51) Int. Cl.
*H03G 9/00* (2006.01)
*H03G 3/00* (2006.01)

(52) U.S. Cl.
USPC .............. 381/102; 381/80; 381/104; 381/107

(58) Field of Classification Search
CPC ......... H03G 3/00; H03G 3/001; H03G 3/002; H03G 5/04; H03G 5/16; H03G 5/165; H03G 1/0088; H03G 9/02; H03G 9/025; H03G 9/06; H03G 2201/30; H03G 2201/70; H04R 27/00; H04R 5/04; H04R 3/12
USPC .............. 381/80, 81, 321, 101, 102, 104, 105, 381/107, 109, 110, 17–23; 330/254, 278

See application file for complete search history.

(56) References Cited

U.S. PATENT DOCUMENTS 5,255,325 A * 10/1993 Ishimitsu et al. ............. 381/107
5,272,756 A * 12/1993 Tanaka et al. ................. 381/12

(Continued)

FOREIGN PATENT DOCUMENTS

CN 1350365 A 5/2002
CN 1706112 A 12/2005

(Continued)

OTHER PUBLICATIONS

Chinese Office Action issued Feb. 12, 2010 in corresponding Chinese Patent Application 200910015063.

(Continued)

*Primary Examiner* — Xu Mei
(74) *Attorney, Agent, or Firm* — Huawei Device Co., Ltd.

(57) ABSTRACT

A method and an apparatus for controlling gain in a multi-audio channel system as well as a voice processing system are disclosed. The method includes: judging whether signals on any audio channels are similar or correlated; sorting audio channels of similar or correlated signals into one group if the similar or correlated signals exist on the audio channels, and using the same Automatic Gain Control (AGC) unit to process signals of this group of audio channels; and using different AGC units to process other non-similar or non-correlated signals on audio channels. The gain control apparatus includes: a judging unit, a grouping unit, a control processing unit, and at least two AGC units. Therefore, in a multi-audio channel communication, the perception of the sound locations of similar or correlated audio channels is not damaged, and the non-similar or non-correlated audio channels doe not interfere with each other.

10 Claims, 7 Drawing Sheets

(56) References Cited

U.S. PATENT DOCUMENTS

| | | | |
|---|---|---|---|
| 5,617,478 A * | 4/1997 | Tagami et al. | 381/56 |
| 5,784,476 A * | 7/1998 | Bird | 381/107 |
| 7,016,501 B1 * | 3/2006 | Aylward et al. | 381/22 |
| 7,298,207 B2 * | 11/2007 | Yim et al. | 330/133 |
| 7,795,967 B2 * | 9/2010 | Nakai et al. | 330/129 |
| 8,290,181 B2 * | 10/2012 | Stokes et al. | 381/107 |
| 2004/0005067 A1 * | 1/2004 | Aiso et al. | 381/107 |
| 2004/0008851 A1 | 1/2004 | Hagiwara | |
| 2004/0102168 A1 | 5/2004 | Ahn et al. | |
| 2006/0148435 A1 | 7/2006 | Romesburg et al. | |
| 2008/0025520 A1 | 1/2008 | Sakai et al. | |
| 2009/0046872 A1 * | 2/2009 | Vollmer | 381/102 |

FOREIGN PATENT DOCUMENTS

| | | |
|---|---|---|
| CN | 101115324 A | 1/2008 |
| CN | 101133552 A | 2/2008 |
| CN | 101136733 A | 3/2008 |
| CN | 101478296 A | 7/2009 |

OTHER PUBLICATIONS

International Search Report mailed Apr. 1, 2010 in corresponding International Patent Application PCT/CN2009/076051.

Written Opinion of the International Searching Authority mailed Apr. 1, 2010 in corresponding International Patent Application PCT/CN2009/076051.

Translation of Chinese Office Action issued Feb. 12, 2010 in corresponding Chinese Patent Application 200910001506.3 (2pgs).

First Chinese Office Action issued Feb. 12, 2010 in corresponding Chinese Patent Application No. 200910001506.3 (3 pages) (2 pages English translation).

Second Chinese Office Action issued Jun. 27, 2011 in corresponding Chinese Patent Application No. 200910001506.3 (3 pages) (1 page English translation).

Notification of Patent Allowance for Intervention Patent Application issued Sep. 26, 2011 in corresponding Chinese Patent Application No. 200910001506.3 (1 page) (2 pages English translation).

European Office Action issued Jun. 29, 2012 in corresponding European Patent Application No. 09 836 037.3-1233 (4 pages).

English Abstract for: Hu Ze, "Coding and Application of a Multi-Channel Digital Audio System," Collection of Theses on Motion Picture and Television Technologies of China Society of Motion Picture and Television Engineers, pp. 206-215, 2002 (1 page of English Abstract).

Extended European Search Report, mailed Nov. 10, 2011, in corresponding European Application No. 09836037.3 (7 pp.).

* cited by examiner

METHOD AND APPARATUS FOR CONTROLLING GAIN IN MULTI-AUDIO CHANNEL SYSTEM, AND VOICE PROCESSING SYSTEM

CROSS-REFERENCE TO RELATED APPLICATIONS

This application is a continuation of International Application No. PCT/CN2009/076051, filed on Dec. 25, 2009, which claims priority to Chinese Patent Application No. 200910001506.3, filed on Jan. 5, 2009, both of which are hereby incorporated by reference in their entireties.

FIELD OF THE INVENTION

The present invention relates to communications technologies and signal processing technologies, and in particular, to a method and an apparatus for controlling gain in a multi-audio channel system, and a voice processing system.

BACKGROUND OF THE INVENTION

With growing operation capacity of high-speed processing chips, it is more and more popular to implement function parts of a communication system by digital means. Due to change of the transmission path or other factors, the signal strength in the transmission process fluctuates sharply. Therefore, it is necessary to adjust the amplitude of signals on the receiver, namely, reduce the gain of the signals when the input signals are strong, or enhance the gain of the signals when the signals are weak. The gain control methods include Automatic Gain Control (AGC) and Manual Gain Control (MGC). Currently, the AGC is generally applied, which enables the receiver to adapt to the change of the input signals automatically and ensures normal work of the communication system.

In a voice processing system, the AGC algorithm is one of three commonly used audio preprocessing methods. The AGC keeps steady volume of voice, and prevents too small or too large volume caused by dynamic change of the voice and the model of the microphone. The AGC prevents the sound of a large volume from being distorted, and prevents the sound of a small volume from attenuating excessively.

In the automatic gain control on the voice signals, if two audio channels are in use, the data on the two audio channels is combined into one-channel data and input to the AGC unit, and the gain is calculated out and applied to the data on the two audio channels. The AGC algorithm processing uses the correlation state of the signals of the previous frame, and the correlation state is buffered for a certain time before being output. Therefore, different audio channels cannot be processed by the same AGC unit.

In an AGC method for processing multiple audio channels in the prior art, multiple audio channels are processed by their respective AGC units. For example, as shown in FIG. 1, the multi-audio channel system uses multiple AGC units corresponding to multiple audio channels to process data respectively.

When different audio channels collect the sound from the same source, the AGC unit of each channel processes the data respectively. Some audio channels may amplify the sound, and other audio channels may attenuate the sound, which damages the perception of the sound locations and orientation sense of the original sound and loses the effect of the original stereo sound.

In another solution provided in the prior art, multiple audio channels are processed by the same AGC unit. As shown in FIG. 2, the mean value of amplitudes of multiple audio channels is input into the AGC unit, the gain of this frame of data is calculated out, and all audio channels are amplified uniformly.

This solution is practicable when multiple audio channels transmit the sound from the same source, but is defective when the audio channels transmit the sound from different sources. When the audio channels transmit the sound from different sources, the average amplitude value of all audio channels is input to the AGC unit, and the amplitude is controlled for all audio channels uniformly. Consequently, the sound that should be amplified is attenuated, and the sound that should be attenuated is amplified. In this way, after the signals on all audio channels are processed, the effect of the signals is deteriorated, and even the signals on some audio channels are distorted.

SUMMARY OF THE INVENTION

A method and an apparatus for controlling gain in a multi-audio channel system as well as a voice processing system are provided herein to prevent signal distortion after signals are transmitted and amplified.

A method for controlling gain in a multi-audio channel system is provided in an embodiment of the present invention. The method includes:

judging whether signals on any audio channels are similar or correlated; and sorting audio channels of similar or correlated signals into one group if the similar or correlated signals exist on the audio channels and using the same AGC unit to process signals on this group of audio channels, and using different AGC units to process non-similar or non-correlated signals on audio channels.

An apparatus for controlling gain in a multi-audio channel system is provided in an embodiment of the present invention. The apparatus includes:

a judging unit, configured to judge whether signals on any audio channels are similar or correlated;

a grouping unit, configured to sort audio channels of similar or correlated signals into one group if the judging unit determines that the similar or correlated signals exist on the audio channels;

at least two AGC units, configured to exercise gain control on signals on each group of audio channels respectively; and a control processing unit, configured to switch signals on the same group of audio channels to the same AGC unit for processing, and control different AGC units to process non-similar or non-correlated signals on audio channels.

A voice processing system provided in an embodiment of the present invention includes an audio signal obtaining unit, a gain control apparatus, and an audio signal processing unit. The audio signal obtaining unit submits signals on at least two audio channels to the gain control apparatus; and the gain control apparatus sends the signals on the at least two audio channels to the audio signal processing unit after the gain of the signals is adjusted. The gain control apparatus includes:

a judging unit, configured to judge whether audio signals on any audio channels are similar or correlated;

a grouping unit, configured to sort audio channels of similar or correlated audio signals into one group if the judging unit determines that the similar or correlated audio signals exist on audio the channels;

at least two AGC units, configured to exercise gain control on signals on each group of audio channels respectively; and a control processing unit, configured to switch audio signals on the same group of audio channels to the same AGC unit for processing, and control different AGC units to process non-similar or non-correlated signals on audio channels.

In the technical solution provided in the embodiments, the similar or correlated audio channels are processed by the same AGC unit, and non-similar or non-correlated audio channels are processed by different AGC units. Therefore, during gain control in the multi-audio channel communication, the perception of the sound locations of similar or correlated audio channels is not damaged, the sound of non-similar or non-correlated audio channels does not mask each other after due to the AGC, and the signals are never distorted after being transmitted and amplified.

DETAILED DESCRIPTION OF THE EMBODIMENTS

The embodiments of the present invention provide a method and an apparatus for controlling gain in a multi-audio channel system as well as a voice processing system so that audio channels can be grouped according to similarity or correlation of sound on the audio channels. The audio channels that transmit similar or correlated sound are sorted into one group, and the audio channels in the same group are processed by the same AGC unit. Therefore, the perception of the sound location of the sound is protected, the sound in different groups of audio channels does not mask each other, and the quality of sound in the audio channels is ensured in the multi-audio channel communication.

Figure 1:
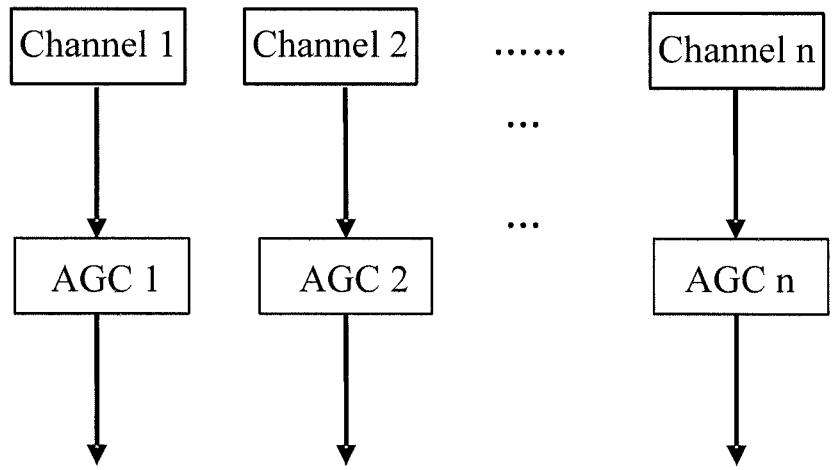
FIG. 1 shows a multi-channel AGC processing mode in the prior art.
Figure 2:
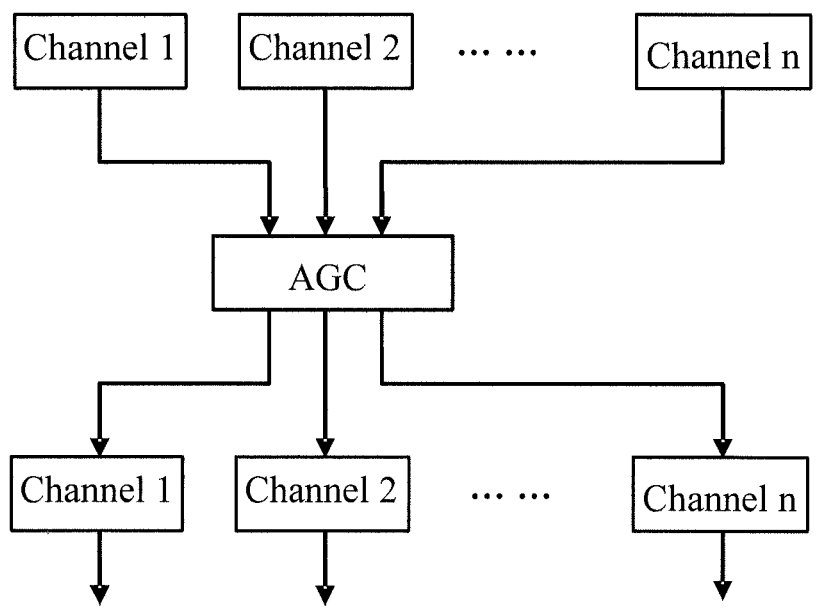
FIG. 2 shows another multi-audio channel AGC processing mode in the prior art.
Figure 3:
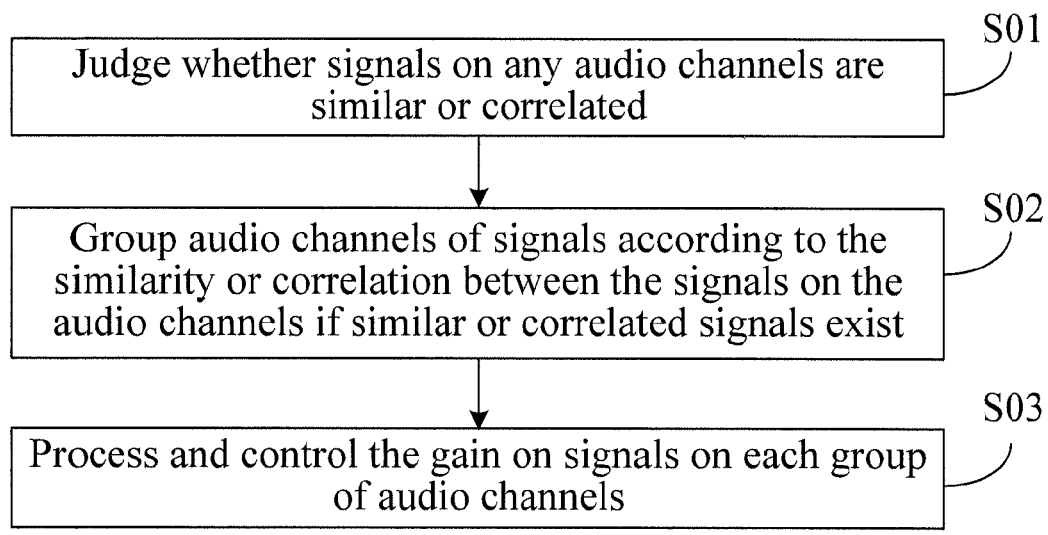
FIG. 3 is a flow chart of a gain control method according to an embodiment of the present invention.

As shown in FIG. 3, a method for controlling gain in a multi-audio channel system according to an embodiment of the present invention includes:

S01. Judge whether signals on any audio channels are similar or correlated.

Specifically, if the similarity or correlation between signals on two audio channels exceeds a preset value, it is determined that the signals on the two audio channels are similar or correlated.

The similarity or correlation between the signals on audio channels may be judged through a correlation method, Minimum Mean Square Error (MMSE), or maximum likelihood method, as detailed below. Alternatively, the information indicative of similarity or correlation between two audio channels is transmitted to the grouping unit through the upper layer, and therefore, the grouping unit can group the audio channels according to such information.

(1) Correlation Method

A cross-correlation coefficient of two signals x[n] and y[n] on audio channels is calculated in the following formula:

$$\rho_{xy}[l] = \frac{r_{xy}[l]}{\sqrt{r_{xx}[0]r_{yy}[0]}}$$

In the formula above, $$r_{xx}[l] = \sum_{n=0}^{N} x[n]x[n-l].$$

l=0 is substituted into the coefficient $\rho_{xy}[l]$ to calculate the value of the coefficient, which is the value of the cross-correlation coefficient when the delay between the two signals on audio channels is 0. When the coefficient is greater than a specific value Th (the Th may be a value measured in an actual environment), it is deemed that the two signals on audio channels are correlated with each other.

(2) MMSE Method:

The MMSE between two signals x[n] and y[n] on audio channels is calculated in the following formula:

$$\delta_{xx}[l] = \sum_{n=0}^{N} \sqrt{|(x^2[n+l] - y^2[n])|}$$

In the formula above, l=0, and a value of $\delta_{xx}[0]$ is calculated. If this value is less than a specific value Th (the Th may be a value measured in an actual environment), it is deemed that the two signals x[n] and y[n] on audio channels are correlated with each other.

(3) Maximum Likelihood Method

Signals on audio channels get through a filter, and parameters of the filter are selected properly to let the sine wave signals on audio channels under the required frequency pass through the filter without distortion, and achieve a minimum mean square value output after sine wave signals on audio channels under all other frequencies get through the filter. Under such conditions, the mean square value output after the signals on audio channels get through the filter serves as an estimate value of the maximum likelihood power spectrum. If the estimate value of the maximum likelihood power spectrum of the signal x[n] is very close to that of the signal y[n] and the estimate values of the maximum likelihood power spectrums of x[n] and y[n] are greater than a threshold, the two signals on audio channels are regarded as correlated.

The process of judging similarity or correlation between the signals on any audio channels may be performed for every frame of data to be processed, or performed at intervals according to the specific voice system.

S02. Group audio channels of the signals according to the similarity or correlation between the signals on audio channels.

Audio channels of the similar or correlated signals are sorted into one group if the similar or correlated signals exist on the audio channels.

S03. Process and control the gain on signals on each group of audio channels.

The signals on each group of audio channels are processed by the same AGC unit, and signals on other audio channels are processed by different AGC units respectively.

To make the principles, features and merits of the present invention clearer, the following describes the embodiments of the present invention in more detail with reference to the accompanying drawings.

Embodiment 1

In this embodiment, it is assumed that the gain control is performed in a dual-audio channel system.

Figure 4:
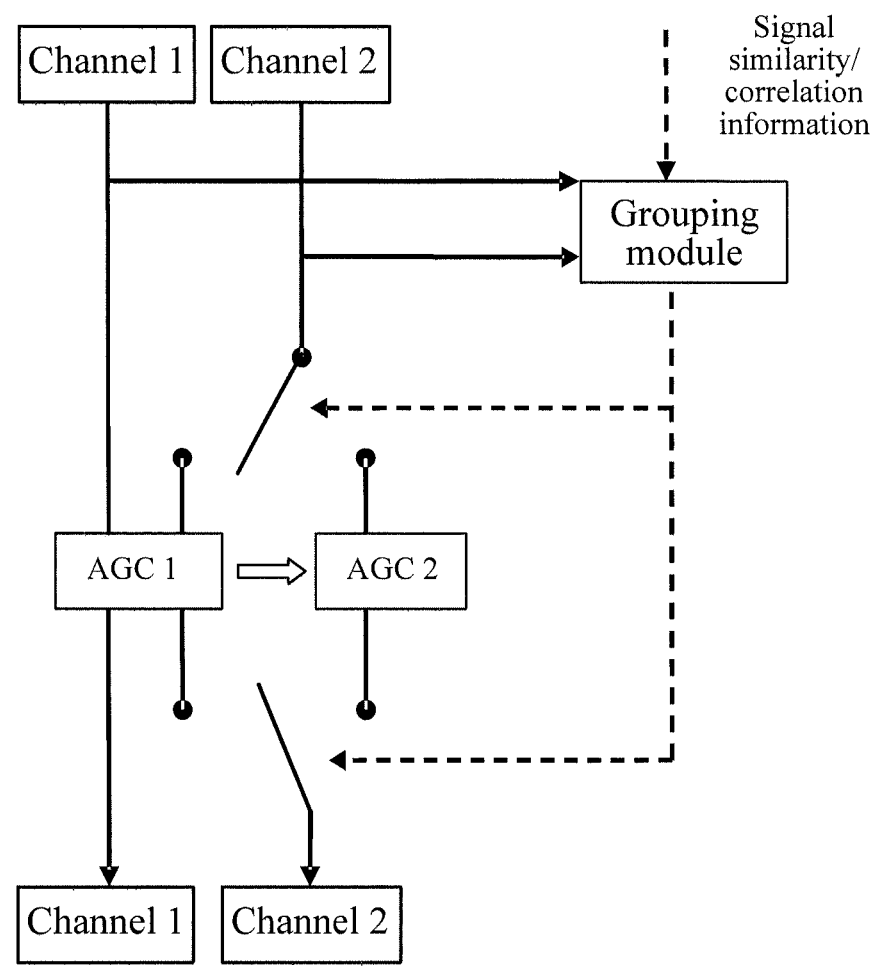
FIG. 4 shows a schematic diagram of AGC principles according to Embodiment 1 of the present invention.

As shown in FIG. 4, in a dual-audio channel scenario, similarity or correlation of sound between the two audio channels is judged first. If the similarity or correlation between signals on the two audio channels reaches a preset threshold, the two audio channels are sorted by the grouping module into the same group. A control switch inputs signals on audio channels in the same group into the same AGC unit (namely, AGC 1 in the figure), and the gain of such signals on audio channels is processed and controlled by the same AGC unit (namely, AGC 1). If the two audio channels are not similar, the grouping module sorts them into two different groups, and each group is processed by a different AGC unit. That is, audio channel 1 is processed by AGC 1, and audio channel 2 is processed by AGC 2.

Figure 5:
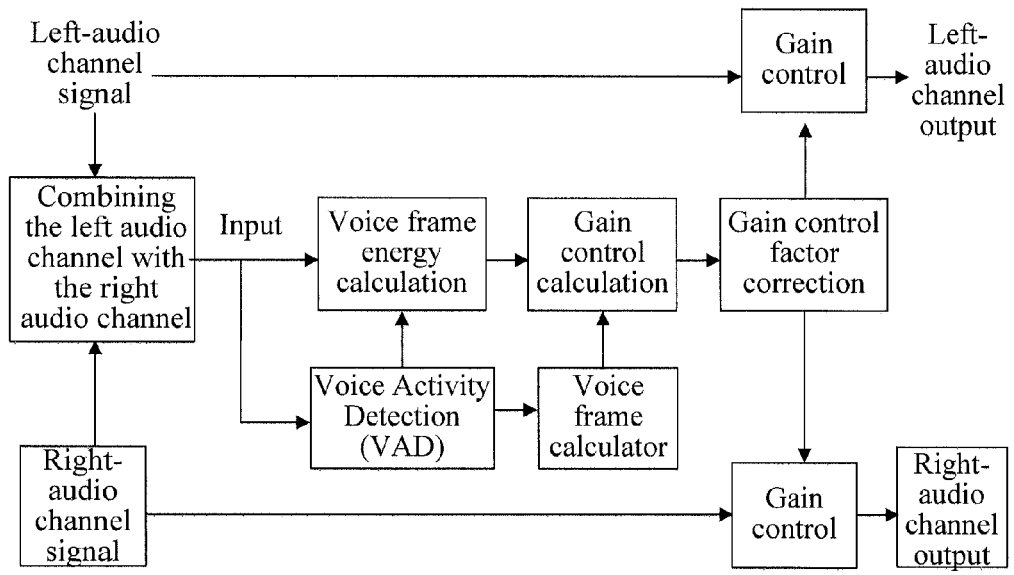
FIG. 5 shows how two audio channels use the same AGC according to Embodiment 1 of the present invention.

For example, if only one person is speaking, because the sound source is the same, the sound collected by two audio channels is very similar. In this case, the grouping unit uses the same AGC for processing the sound of the two audio channels, as shown in FIG. 5. The detailed procedure is as follows:

The signals on the two audio channels (namely, signal on the left audio channel and signal on the right audio channel) are combined into single-audio channel signals as input to the AGC unit. A mean energy value of the single-audio channel signals is calculated out and input to the AGC unit for estimating the voice frame energy, detecting voice activities (Voice Activity Detection (VAD)), calculating the voice frame, calculating the gain control, and correcting the gain control factor. The corrected gain factor is used to control gain of the signals on the original left audio channel and the original right audio channel uniformly.

If one audio channel transmits voice of one person but the other audio channel transmits voice of a different person, the similarity and the correlation between signals on the two audio channels are very low, and the grouping unit selects different AGC units for processing the signal of the two audio channels respectively. If only one person speaks sometimes, but two or more persons speak occasionally, the grouping unit switches between the two procedures above. If only one AGC (such as AGC 1 in FIG. 3) is in use, the state of AGC 1 needs to be synchronized to AGC 2 to ensure non-correlation of data between the two audio channels, the state processed by AGC 2 is applied to audio channel 2 to ensure continuity. In this case, the processing of AGC 1 and AGC 2 is basically the same as the prior art, and is not repeated herein.

Therefore, the similar or correlated audio channels are processed by the same AGC unit, and non-similar or non-correlated audio channels are processed by different AGC units. Therefore, in the AGC in the multi-audio channel communication, the perception of the sound locations of similar or correlated audio channels is not damaged, and the sound of non-similar or non-correlated audio channels does not mask each other due to the AGC.

Embodiment 2

In a multi-audio channel application scenario, assuming that the number of audio channels is n (n>2), similarity or correlation of sound between the audio channels is judged first. The judgment method is similar to the dual-audio channel scenario in Embodiment 1. Similar or correlated audio channels are sorted into one group. If k (k<n) audio channels are similar, the k audio channels are sorted into group 1, which is processed by the same AGC unit; if L (L<n) audio channels are correlated, the L audio channels are sorted into group 2, which is processed by the same AGC unit. Other similar or correlated audio channels are grouped in the same way. For example, there are m (2<m≤n) groups in total, which are processed by m AGC units respectively.

Figure 6:
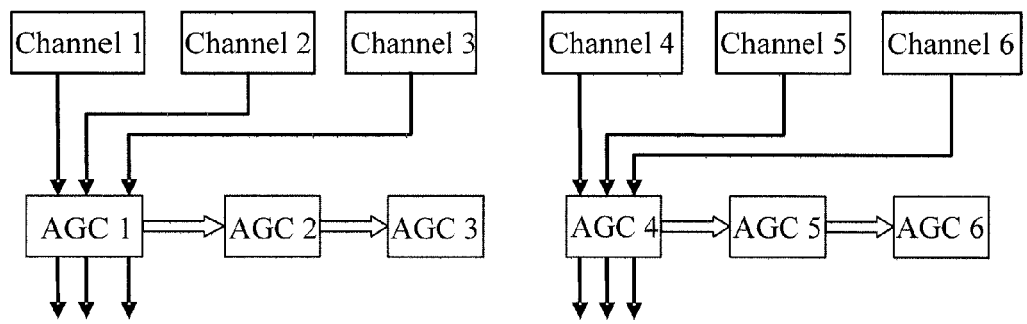
FIG. 6 shows a schematic diagram of AGC principles according to Embodiment 2 of the present invention.

As shown in FIG. 6, a 6-audio channel communication system is described below as an example.

First, 6 AGC units are created, and each audio channel is bound to an AGC unit. Audio channel 1 is bound to AGC 1, audio channel 2 is bound to AGC 2, and so on. As shown in FIG. 6, audio channel 1, audio channel 2, and audio channel 3 form one group if they are correlated; audio channel 4, audio channel 5, and audio channel 6 form another group if they are correlated. Audio channel 1, audio channel 2, and audio channel 3 are processed by AGC 1 of audio channel 1 (or another AGC in this group), and the state of AGC 1 is synchronized to AGC 2 and AGC 3. Audio channel 4, audio channel 5, and audio channel 6 are processed in the same way. The work procedure of AGC 1 is the same as that described in Embodiment 1 above except that an average energy value of the signals on audio channel 1, audio channel 2, and audio channel 3 is calculated out and then input to AGC 1 for processing.

In the technical solution provided herein, the similar or correlated audio channels are processed by the same AGC unit, and non-similar or non-correlated audio channels are processed by different AGC units. Therefore, in the multi-audio channel communication, the perception of the sound locations of similar or correlated audio channels are not damaged, and the non-similar or non-correlated audio channels do not interfere with each other.

Embodiment 3

Figure 7:
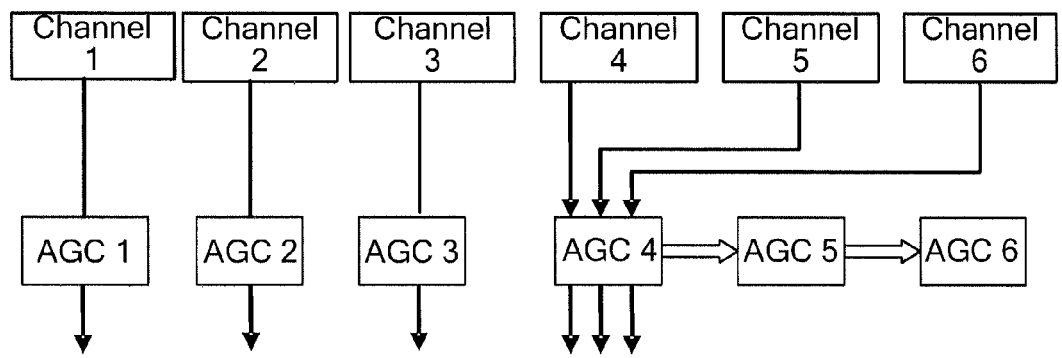
FIG. 7 shows a schematic diagram of AGC principles according to Embodiment 3 of the present invention.

In this embodiment, if the correlation between the 6 audio channels in Embodiment 2 changes, the 6 audio channels are regrouped by the grouping unit. For example, as shown in FIG. 7, after the correlation changes, none of audio channel 1, audio channel 2, and audio channel 3 is similar or correlated to other audio channels, but audio channel 4, audio channel 5, and audio channel 6 are correlated. Therefore, the grouping unit puts them into four groups: audio channel 1, audio channel 2, and audio channel 3 form three different groups, and audio channel 4, audio channel 5, and audio channel 6 form one group.

Audio channel 1, audio channel 2, and audio channel 3 are processed by AGC 1, AGC 2, and AGC 3 respectively, but audio channel 4, audio channel 5, and audio channel 6 are processed by AGC 4 uniformly. The state information of AGC 4 is synchronized to AGC 5 and AGC 6. The state information includes gain adjustment parameters such as envelope energy value of a previous frame of signals, background noise, and smoothed noise count. The previous frame of signals needs to be buffered on AGC 5 and AGC 6 to ensure state continuity in subsequent use of AGC 5 and AGC 6.

On the basis of the foregoing embodiment, the method may further include: checking whether signals on any audio channels come from the same source; if signals on at least two audio channels come from the same source, the signals on the at least two audio channels are combined, and the combined signals are input to the AGC unit to calculate the gain value. This AGC unit is used to process the signals on the two original audio channels uniformly. That is, the signals on the at least two audio channels are copied and then combined into one-channel signals (through overlaying and averaging, or by other means). The combined signals are input to the AGC unit to calculate the gain value, and the same gain value is used to process the signals on the at least two original audio channels uniformly.

The method may further include: calculating a gain control correction factor corresponding to signals on each audio channel that come from a different source if the signals on audio channels come from different sources, and using the correction factor to correct the signals on each audio channel that come from a different source.

If the signals on audio channels come from at least two sources, the signals on audio channels from the same source are processed by the same AGC unit, and the signals on audio channels from different sources are processed by different AGC units.

In the technical solution provided herein, the similar or correlated audio channels are processed by the same AGC unit, and non-similar or non-correlated audio channels are processed by different AGC units. Therefore, in the multi-audio channel communication, the perception of the sound locations of similar or correlated audio channels is not damaged, and the non-similar or non-correlated audio channels do not interfere with each other.

Embodiment 4

Figure 8:
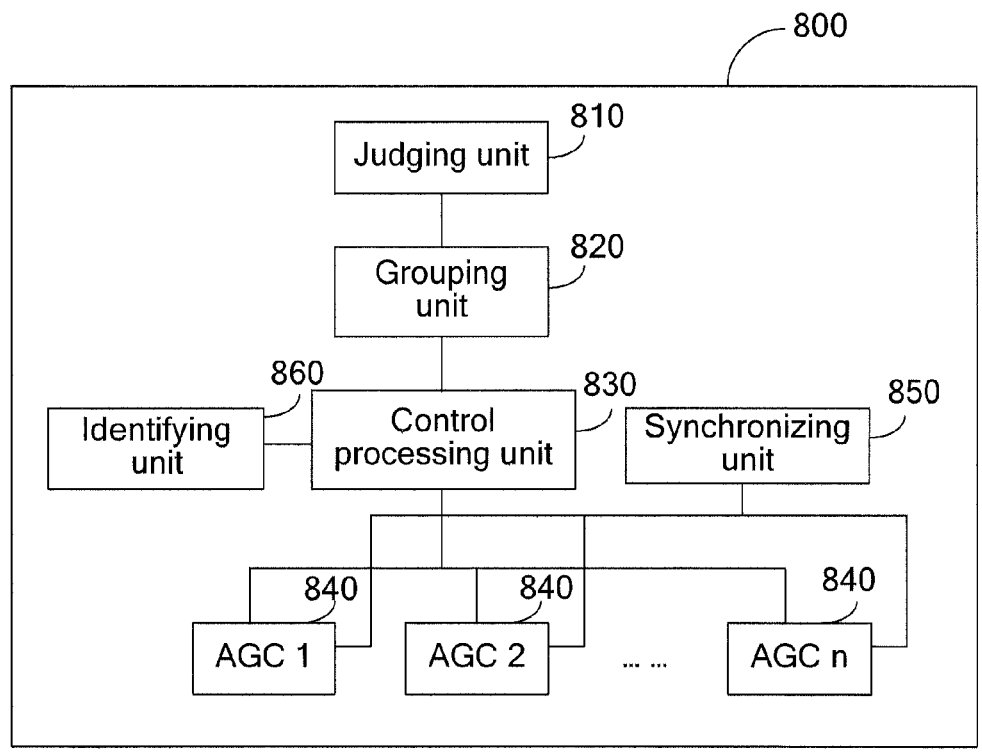
FIG. 8 shows a structural schematic diagram of an AGC apparatus according to Embodiment 4 of the present invention.

As shown in FIG. 8, an apparatus 800 for controlling gain in a multi-audio channel system in this embodiment includes a judging unit, a grouping unit, a control processing unit, and at least two AGC units.

The judging unit 810 is configured to judge whether signals on any audio channels are similar or correlated.

The judging unit 810 judges whether the similarity or correlation between signals on any two audio channels exceeds a preset threshold, and determines that the signals on the two audio channels are similar or correlated if the preset threshold is exceeded.

Specifically, the similarity or correlation between the signals on any audio channels may be judged through a correlation method, MMSE method, or maximum likelihood method. Alternatively, the information indicative of similarity or correlation between two audio channels is transmitted to the grouping unit through the upper layer, and therefore, the grouping unit can group the audio channels according to such information.

The process of judging similarity or correlation between the signals on any audio channels may be performed for every frame of data to be processed, or performed at intervals according to the specific voice system.

The grouping unit 820 is configured to sort audio channels of similar or correlated signals into one group if the judging unit 810 determines that the signals on audio channels are similar or correlated;

The control processing unit 830 is configured to switch the signals on each audio channel or on each group of audio channels to corresponding AGC units, for example, AGC 1 to AGC n 840 in FIG. 8. That is, the control processing unit 830 switches signals on the same group of audio channels to the same AGC unit for processing, and controls different AGC units to process non-similar or non-correlated signals on audio channels.

The at least two AGC units 840 are configured to exercise gain control on the signals on each audio channel respectively.

The control processing unit 830 is configured to switch signals on the same group of audio channels to the same AGC unit for processing, and control other different AGC units 840 to process signals on other audio channels.

The AGC units 840 correspond to audio channels respectively, and the AGC unit 840 corresponding to the signals on one audio channel in a group processes similar or correlated signals on audio channels in this group. The apparatus further includes:

a synchronizing unit 850, configured to synchronize the state of the AGC unit 840 that processes signals on the same group of audio channels to AGC units corresponding to signals on other audio channels in this group.

The apparatus further includes:

an identifying unit 860, configured to check whether signals on any audio channels come from the same source.

The control processing unit is further configured to switch the signals on audio channels from the same source to the same AGC unit for processing, and control different AGC units to process signals on audio channels from different sources. Specifically, the identifying unit 860 is configured to check whether signals on any audio channels come from the same source.

When signals on at least two audio channels come from the same source, the control processing unit combines the signals on the at least two audio channels, and uses the same AGC unit to process the signals on combined audio channels.

That is, the signals on the at least two audio channels are copied and then combined into one audio channel (through overlaying and averaging, or by other means). The signals on combined audio channels are input to the AGC unit to calculate the gain value, and the same gain value is used to process the signals on the at least two original audio channels uniformly.

If the signals on audio channels that come from different sources exist, the control processing unit calculates the gain control correction factor corresponding to signals on each audio channel that come from a different source, and uses the correction factor to correct the signals on each audio channel that come from a different source respectively.

If the signals on audio channels come from at least two sources, the control processing unit is further configured to control the same AGC unit to process the signals on audio channels from the same source, and control different AGC units to process the signals on audio channels from different sources.

Embodiment 5

Figure 9:
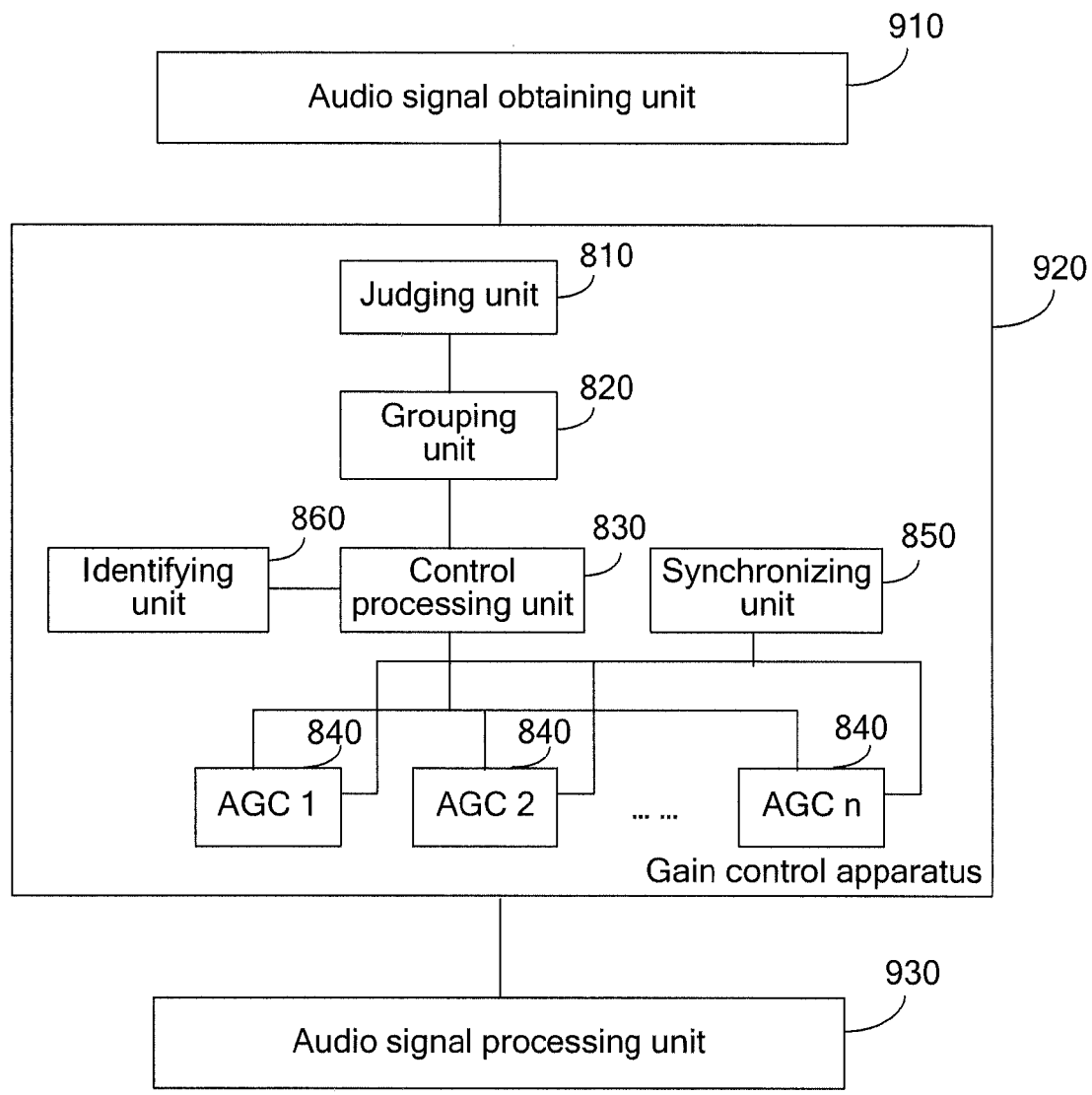
FIG. 9 shows a structure of a voice processing system according to an embodiment of the present invention.

As shown in FIG. 9, a voice processing system provided in this embodiment includes an audio signal obtaining unit 910, a gain control apparatus 920, and an audio signal processing unit 930. The audio signal obtaining unit 910 submits signals on at least two audio channels to the gain control apparatus 920; and the gain control apparatus 920 sends the signals on the at least two audio channels to the audio signal processing unit 930 after the gain of the signals is adjusted. The gain control apparatus 920 is the gain control apparatus described in Embodiment 4 above.

Figure 10:
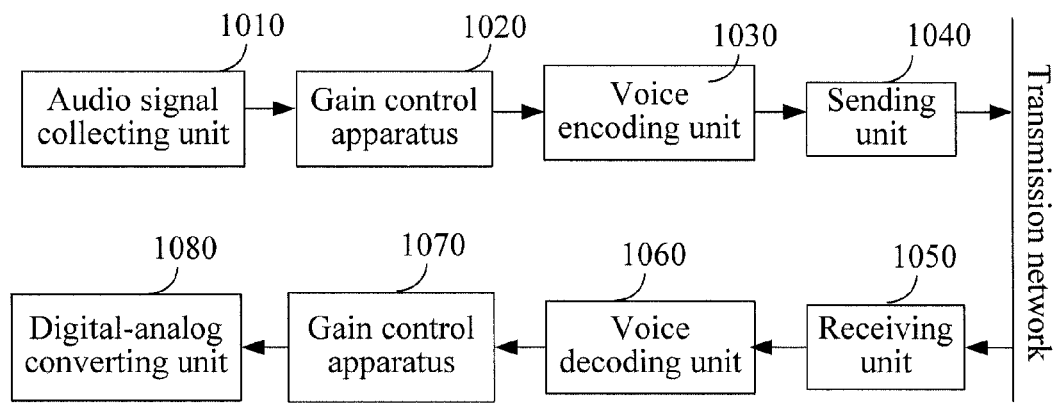
FIG. 10 shows a structure of a voice transmission system according to an embodiment of the present invention.

FIG. 10 shows a voice signal transmission system 1000. The transmitter of the system includes:

an audio signal collecting unit 1010, configured to collect analog audio signals;

a gain control apparatus 1020, configured to control gain of the analog audio signals, where the gain control apparatus is specifically the gain control apparatus described in Embodiment 4 above;

an audio encoding unit 1030, configured to encode the audio signals received from the gain control apparatus; and a sending unit 1040, configured to send the encoded audio signals.

In the voice signal transmission system provided in this embodiment, the audio encoding unit 1030 serves as an audio signal processing unit, and encodes the audio signals that have been processed through gain control on the transmitter so that the signals can be sent to the receiver through a transmission network.

The receiver in the system includes:

a receiving unit 1050, configured to receive the audio signals from the transmitter;

an audio decoding unit 1060, configured to decode the digital audio signals received by the receiving unit 1050;

a gain control apparatus 1070, configured to control gain of the audio signals output by the audio decoding unit 1060, where the gain control apparatus 1060 is the gain control apparatus described in Embodiment 4 above; and a digital-analog converting unit 1080, configured to convert the audio signals output by the gain control apparatus 1070 into analog signals.

On the receiver, after the received audio signals are decoded, the gain control apparatus 1070 processes the decoded signals. As an audio signal processing unit, the digital-analog converting unit 1080 converts the audio signals that have been processed through gain control from digital signals to analog signals so as to recover the original audio signals sent by the transmitter.

It should be noted that in other multi-channel signal transmission system, the solution provided in this embodiment is applicable so long as the same signal or different signals are transmitted in multiple channels, for example, applicable to the scenario of radio diversity technology and receiving of multi-channel photoelectric signals.

In the multi-audio channel communication solution provided herein, the same AGC unit processes signals of similar or correlated audio channels, and different AGC units process signals of non-similar or non-correlated audio channels. Therefore, in the AGC process in the multi-audio channel communication, the perception of the sound locations of similar or correlated audio channels is not damaged, and the sound of non-similar or non-correlated audio channels does not mask each other due to the AGC.

It is apparent to those skilled in the art that: The units and steps described herein may be embodied in general computer devices, and may be integrated in a single computer device or distributed in a network composed of multiple computer devices. Optionally, the units and steps can be implemented by program codes executable by a computer device so that the units and steps can be stored in a storage device and executed by a computer device; or they are embodied in different integrated circuit units respectively; or some of the units or steps are embodied in a single integrated circuit unit. The embodiments of the present invention are not limited to any specific combination of hardware and software.

The above descriptions are merely preferred embodiments of the present invention, but not intended to limit the scope of the present invention. Any modification, equivalent replacement, or improvement made without departing from the spirit and principles of the present invention shall fall within the protection scope of the present invention.

What is claimed is:

1. A method for controlling gain in a multiple audio channel system in which a signal is transmitted on each the multiple audio channels, comprising:

detecting whether signals that are similar to or correlated with each other are present on different ones of the multiple audio channels; and when signals that are similar to or correlated with each other are detected on different ones of the multiple audio channels, using a first Automatic Gain Control (AGC) unit to process the signals that are similar to or correlated with each other, and using one or more second AGC units to process the signals on the multiple audio channels that are not similar to or correlated with each other;

wherein:

an AGC unit is allocated to signals on each audio channel beforehand;

the step of using a first AGC unit to process the signals that are similar to or correlated with each other comprises:

using the first AGC unit corresponding to one of the signals that are similar to or correlated with each other to process the signals; and synchronizing state information of the first AGC unit to the one or more second AGC units.

2. The method for controlling gain according to claim 1, wherein the step of detecting whether signals that are similar to or correlated with each other are present on different ones of the multiple audio channels comprises:

detecting whether a similarity or correlation between signals on any two audio channels of the audio channels exceeds a preset threshold, and determining that the signals on the two audio channels are similar to or correlated with each other when the similarity or correlation exceeds the preset threshold.

3. The method for controlling gain according to claim 1, said detecting whether signals that are similar to or correlated with each other are present on different ones of the multiple audio channels comprising:

checking whether signals on different ones of the multiple audio channels come from a same source; and when signals on at least two of the multiple audio channels come from the same source, said using a first Automatic Gain Control (AGC) unit to process the signals that are similar to or correlated with each other comprising:

combining the signals on the at least two audio channels, calculating a gain value by using the combined signals as input to the first AGC unit, and using the first AGC unit to process the signals on the at least two audio channels.

4. The method for controlling gain according to claim 3, said using one or more second AGC units to process the signals on the multiple audio channels that are not similar to or correlated with each other comprising:

calculating a gain control correction factor corresponding to signals on each audio channel that come from a different source respectively when signals on audio channels coming from different sources exist; and using the correction factor to correct the signals on each audio channel that come from the different source.

5. An apparatus for controlling gain in a multiple audio channel system in which a signal is transmitted on each the multiple audio channels, comprising:

a detecting unit configured to detect whether signals that are similar to or correlated with each other are present on different ones of the multiple audio channels;

a control processing unit configured to, when signals that are similar to or correlated with each other are detected on different ones of the multiple audio channels, route the signals that are similar to or correlated with each other to a first Automatic Gain Control (AGC) unit for processing, and route the signals on the multiple audio channels that are not similar to or correlated with each other to one or more second AGC units;

wherein:

an AGC unit is allocated to signals on each audio channel beforehand;

the first AGC unit corresponding to one of the signals that are similar to or correlated with each other is configured to process the signals; and the apparatus further comprises a synchronizing unit configured to synchronize state information of the first AGC unit to the one or more second AGC units.

6. The apparatus for controlling gain according to claim 5, wherein:

the detecting unit is specifically configured to detect whether a similarity or correlation between signals on any two audio channels of the audio channels exceeds a preset threshold, and determine that the signals on the two audio channels are similar to or correlated with each other when the similarity or correlation exceeds the preset threshold.

7. The apparatus for controlling gain according to claim 5, further comprising:

an identifying unit configured to check whether signals on different audio channels come from a same source, when signals on at least two audio channels come from the same source, the control processing unit is further configured to combining the signals on the at least two audio channels, calculating a gain value by using the combined signals as input to the same AGC unit, and using the same AGC unit to process the signals on the at least two audio channels.

8. A voice processing system, comprising:

an audio signal obtaining unit configured to output a signal on each of multiple audio channels;

a gain control apparatus configured to:

detect whether signals that are similar to or correlated with each other are present on different ones of the multiple audio channels;

when signals that are similar to or correlated with each other are detected on different ones of the multiple audio channels, use a first Automatic Gain Control (AGC) unit process the signals that are similar to or correlated with each other, and use one or more second AGC units to process the signals on the multiple audio channels that are not similar to or correlated with each other; and an audio signal processing unit configured to receive the signals on the multiple audio channels from the gain control apparatus;

wherein:

an AGC unit is allocated to signals on each audio channel beforehand; and the gain control apparatus is further configured to:

use the first AGC unit corresponding to one of the signals that are similar to or correlated with each other to process the signals; and synchronize state information of the first AGC unit to the one or more second AGC units.

9. The voice processing system according to claim 8, wherein:

the audio signal obtaining unit is an audio signal collecting unit, which is configured to collect analog signals on audio channels; and the audio signal processing unit is an audio encoding unit, which is configured to encode the signals on audio channels received from the gain control apparatus.

10. The voice processing system according to claim 8, wherein:

the audio signal obtaining unit is an audio decoding unit, which is configured to decode received digital signals on audio channels; and the audio signal processing unit is a digital-analog converting unit, which is configured to convert signals on audio channels output by the gain control apparatus into analog signals.

\* \* \* \* \*